United States Patent
Lee et al.

(10) Patent No.: US 8,625,949 B2
(45) Date of Patent: Jan. 7, 2014

(54) OPTICAL HEAD

(75) Inventors: Chih-Kung Lee, Taipei (TW); Chih-Jen Chien, Taipei (TW); Yu-Hsun Lee, Taipei (TW); Chun-Yen Chen, Taipei (TW); Yuh-Yan Yu, Taipei (TW); Te-Hsun Chen, Taipei (TW)

(73) Assignee: National Taiwan University, Taipei (TW)

( * ) Notice: Subject to any disclaimer, the term of this patent is extended or adjusted under 35 U.S.C. 154(b) by 113 days.

(21) Appl. No.: 13/421,204

(22) Filed: Mar. 15, 2012

(65) Prior Publication Data

US 2013/0115454 A1  May 9, 2013

(30) Foreign Application Priority Data

Nov. 9, 2011  (TW) .............................. 100140836 A

(51) Int. Cl.
  *G02B 6/00* (2006.01)
  *G02B 6/26* (2006.01)
  *G02B 6/42* (2006.01)
  *F21V 7/04* (2006.01)
  *G02B 5/00* (2006.01)

(52) U.S. Cl.
  USPC ............. 385/133; 385/43; 385/147; 362/551; 359/709

(58) Field of Classification Search
  USPC .............................. 385/43, 133; 359/709, 710
  See application file for complete search history.

(56) References Cited

U.S. PATENT DOCUMENTS

| | | | | |
|---|---|---|---|---|
| 4,697,867 A | * | 10/1987 | Blanc et al. | 385/43 |
| 4,806,289 A | * | 2/1989 | Laursen et al. | 264/1.29 |
| 5,647,041 A | * | 7/1997 | Presby | 385/43 |
| 5,696,865 A | * | 12/1997 | Beeson et al. | 385/146 |
| 7,068,911 B2 | * | 6/2006 | Hatakoshi | 385/146 |
| 7,544,922 B2 | * | 6/2009 | Ueyanagi et al. | 250/216 |
| 7,620,280 B2 | * | 11/2009 | Dimmick et al. | 385/123 |
| 2002/0031299 A1 | * | 3/2002 | Hatakoshi | 385/31 |
| 2005/0123245 A1 | * | 6/2005 | Hatakoshi | 385/43 |
| 2006/0115971 A1 | * | 6/2006 | Bau et al. | 438/591 |
| 2008/0050078 A1 | * | 2/2008 | Digonnet et al. | 385/125 |
| 2009/0060429 A1 | * | 3/2009 | Dimmick et al. | 385/96 |
| 2010/0195678 A1 | * | 8/2010 | Kuka | 372/6 |
| 2013/0115454 A1 | * | 5/2013 | Lee et al. | 428/375 |

FOREIGN PATENT DOCUMENTS

TW  200848785 A  12/2008

OTHER PUBLICATIONS

Yu-Hsun Lee, "Experimental and Simulation Studies of Using Hollow Micro-tube to Make the Sub-Wavelength Annular Aperture Structure for Optical Lithography Exposure System", Published Aug. 10, 2011.

* cited by examiner

*Primary Examiner* — Rhonda Peace
(74) *Attorney, Agent, or Firm* — Edwards Wildman Palmer LLP; Peter F. Corless; Steven M. Jensen

(57) ABSTRACT

Disclosed is an optical head, including a hollow micro-pipe and a stuffing member, the micro-pipe having a diameter-extended portion and a diameter-diminishing portion adapted allowing the incident light to transmit from the diameter-extended portion to the diameter-diminishing portion to emerge from its tip, and the stuffing member being disposed inside of the micro-pipe compared to prior techniques. The optical head of the invention is easier to be made, and it has a better focus for achieving optical exposure of sub-wave length focal spot and deep depth of focus.

15 Claims, 5 Drawing Sheets

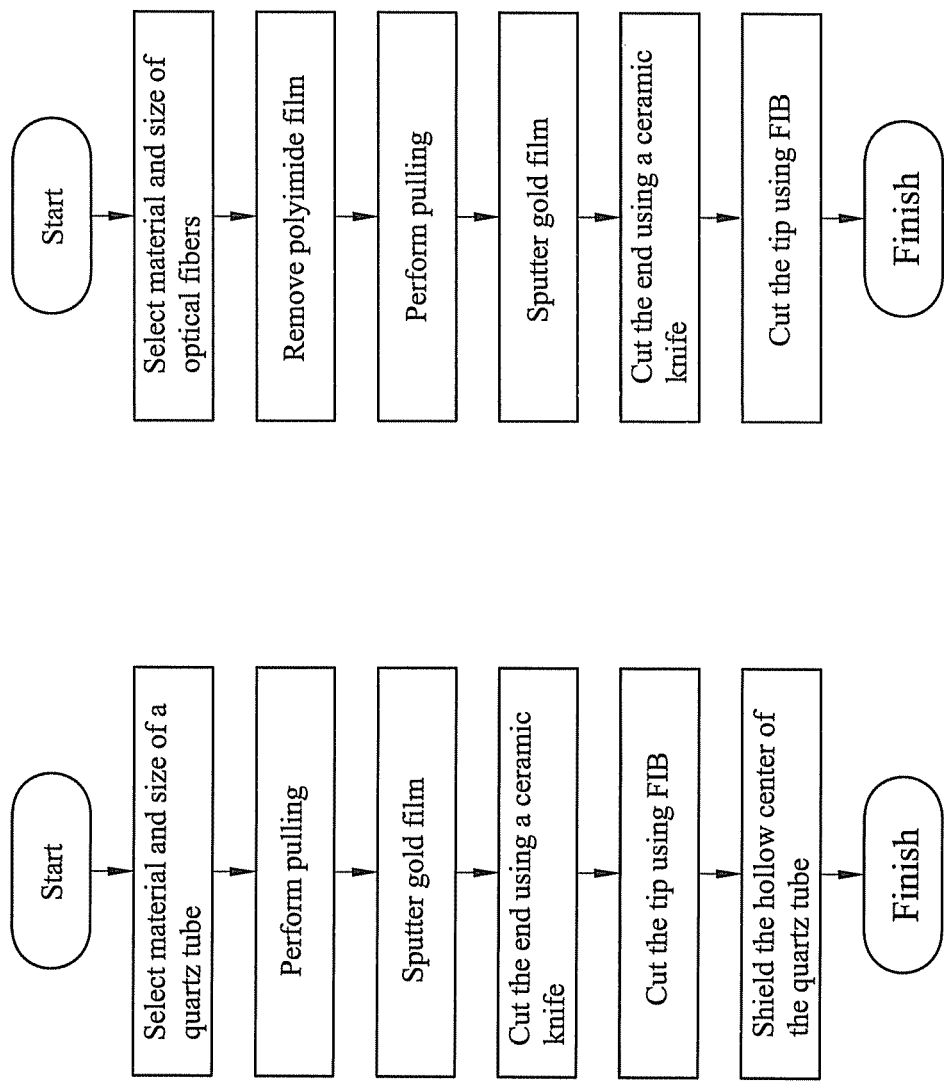

OPTICAL HEAD

CROSS-REFERENCES TO RELATED APPLICATIONS

This application claims under 35 U.S.C. §119(a) the benefit of Taiwanese Application No. 100140836, filed Nov. 9, 2011, the entire contents of which is incorporated herein by reference.

BACKGROUND OF THE INVENTION

1. Field of the Invention

The present invention relates to optical heads, and more particularly, to an optical head for use in photolithography.

2. Description of Related Art

Along with the development of semiconductor products toward miniaturization, photolithography is continuously required to have a reduced line-width, i.e. a narrower light beam.

Based on Rayleigh's criteria, the resolution (e.g. focal spot) and DOF (depth of focus) depend on the incident wavelength and numerical aperture (NA) of the imaging system. Two methods can be implemented to decrease the focal spot: by reducing the wavelength of the light source and by increasing the numerical aperture (NA) of the lens. The Rayleigh criterion is the generally accepted criterion for the minimum resolvable detail—the imaging process is said to be diffraction-limited when the first diffraction minimum of the image of one source point coincides with the maximum of another. Some attempts have been used to reduce the focal spot by applying near-field optics, for example, a SNOM probe (see "Scanning near-field optical probe with ultrasmall spot size", L. Novotny, D. W. Pohl, and B. Hecht, Optics Letters, Vol. 20, Issue 9, pp. 970-972 (1995)). A SNOM probe is a light-emitting probe consists of a metal-cladded, sharply pointed transparent structure, most commonly a tapered optical fiber. The foremost end of the SNOM probe is left uncoated to form a narrow aperture. The focal spot of the SNOM probe is mainly determined by the aperture of the SNOM probe and is capable of reducing to several tens of nm (see "Scanning near-field optical probe with ultrasmall spot size", L. Novotny, D. W. Pohl, and B. Hecht, Optics Letters, Vol. 20, Issue 9, pp. 970-972 (1995)). However, the resulting DOF becomes extremely shallow and causes difficulties in real application.

With a shallow DOF, the exposure environment and platform control will have stricter demands. On the other hand, the shallow DOF may limit the ability to fabricate a structure having a high aspect ratio thereby significantly reducing its implementability.

Therefore, how to provide a deeper DOF for the SNOM probe is becoming one of the most desperate issues in the art.

SUMMARY OF THE INVENTION

In view of the shortcomings of the prior art, the present invention provides an optical head, including: a hollow micro-pipe formed by transparent material and having a diameter-extended portion and a diameter-diminishing portion connected at one end thereto; and a stuffing member formed by non-transparent material; wherein the stuffing member is stuffed inside the hollow micro-pipe so that when an incident light is introduced into the hollow micro-pipe, a center-shielding effect provided by the stuffing member makes the incident light transmit along the wall of the hollow micro-pipe, and the incident light is focused by the diameter-diminishing portion to form a deep focal length.

According to an embodiment of the claimed invention, the diameter-diminishing portion can be cone shaped and the ratio of inner diameter to outer diameter of the hollow micro-pipe is 0.7 to 0.8.

According to an embodiment of the claimed invention, the stuffing member is a column body (e.g., a carbon bar) and a metal layer is formed on an external surface the stuffing member.

According to an embodiment of the claimed invention, the optical head further comprises a shielding layer formed on a boundary of a diameter-extended portion and a diameter-diminishing portion and an external surface peripheral to the boundary.

According to an embodiment of the claimed invention, the shielding layer is completely formed on an external surface of the hollow micro-pipe, and is made of metal or non-materiel.

According to an embodiment of the claimed invention, the outer diameter on the tip of the diameter-diminishing portion can be smaller than 20 μm.

Given the above, the optical head according to the present invention has a simpler structure and thus can be fabricated and integrated into an exposure system more easily. Moreover, the optical head according to embodiments of the present invention realizes the superior sub-wavelength focal spot and desired depth of focus.

BRIEF DESCRIPTION OF DRAWINGS

FIG. 5 is a flow chart of fabricating the optical head from a quartz tube according to an embodiment of the present invention; and FIG. 6 is a flow chart of fabricating the optical head from optical fibers according to an embodiment of the present invention.

DETAILED DESCRIPTION OF PREFERRED EMBODIMENTS

The followings illustrate implementing method of the present invention by a specific embodiment; those skilled in the art can easily understand other advantages and efficacy of the present invention from the present specification.

Notice that the structures, ratios and sizes illustrated in the accompanying figures, are only for aiding to explanation of the disclosed context for the understanding and reading of ordinarily skilled artisans rather than limiting the condition of implementing the present invention thus having no actual technical meaning. Any structural modification, change of ratio relationship or adjustment of size lie in the scope of the disclosed technical context comprised by the claims of the present invention under no influence on the resultant efficacy and attainable purposes of the present invention. Meanwhile, the terms quoted in the present invention such as "up", "extended", "diminishing", "cone-shaped", "inner", "outer", "internal", "external", "shielding", "boundary" and "peripheral" are for clear description rather than limiting the achievable scope of the present invention. Change or adjustment on relative relations should be regarded as the achievable scope of the present invention without actual change of the technical context.

Figure 1:
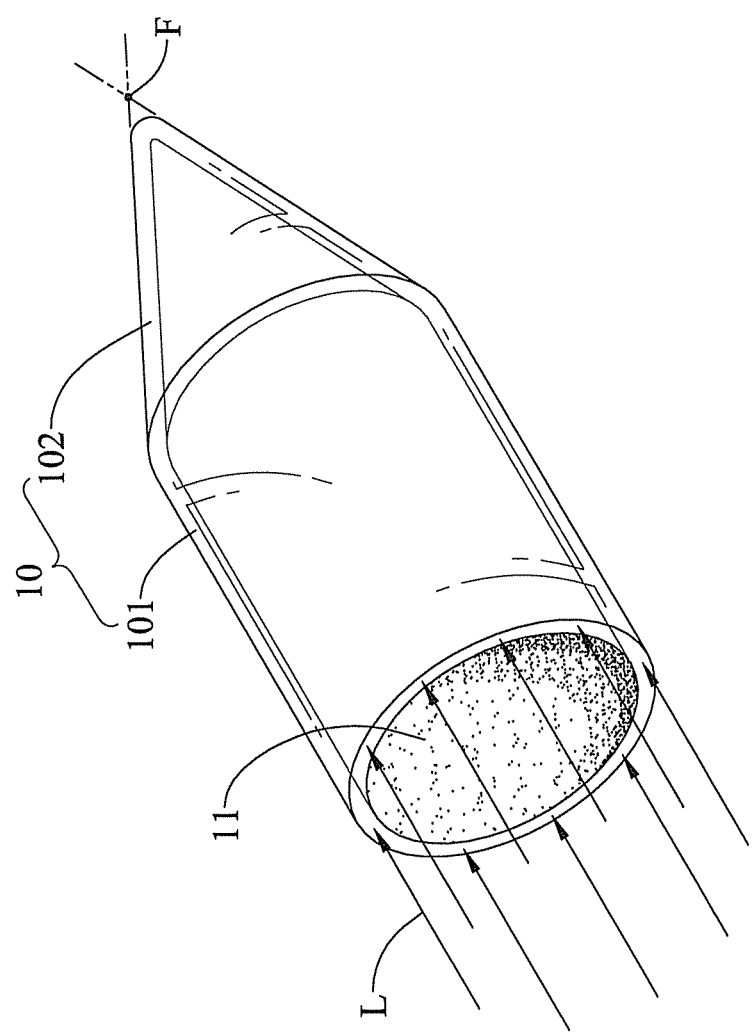
FIG. 1 is a schematic view of the optical head according to an embodiment of the present invention.

Referring to FIG. 1, a schematic view of the optical head according to the present invention. As shown in the drawing, a focal optical head according to an embodiment of the present invention includes: a hollow micro-pipe 10 which is made of transparent material and has a diameter-extended portion 101 and a diameter-diminishing portion 102 connected to the diameter-extended portion 101, used to transmit an incident light L from the diameter-extended portion 101 to the diameter-diminishing portion 102; and a stuffing member 11, which is stuffed inside the hollow micro-pipe 10 in which a center shielding effect provided by the stuffing member 11 makes the incident light L form a deeper focal length through the diameter-diminishing portion 102. Generally, it is appreciated that the outer diameter on the tip of the diameter-diminishing portion 102 is smaller than 20 μm.

In the optical head according to an embodiment of the present invention, for changing the near field to the far field, a fabricating method similar to that of a near-field probe is applied. The hollow micro-pipe 10 is made by using a puller to pull a hollow micro-pipe (such as quartz capillary or optical fiber) into the diameter-diminishing portion 102, forming a tubular optical head having a sub-wavelength annular aperture (SAA). That is, the incident light L leaves from the opening on the tip of the diameter-diminishing portion 102, generating a Bessel beam having a deeper focal length focused on the focus F.

Moreover, for preventing the light transmitting in the hollow micro-pipe 10 leaking from the external surface of a wall thereof, the hollow micro-pipe 10 can be formed with a shielding layer (not shown, due to extremely small in thickness) on the external surface of the hollow micro-pipe. Two ends of the micro-pipe 10 have to be left uncoated with the shielding layer in order to lead the light L in and out. In an implementation, it is more convenient to form the shielding layer by sputtering of metal, but a shielding layer made of metal material absorbs partial light energy that causes the final output light intensity to decrease. Accordingly the thickness of the shielding layer should not be designed as too thick. For example, the metal layer having thickness of 100 to 150 nm is enough, and ideally a shielding layer of non-metal material without absorbing light energy is most preferred.

As mentioned above, light leakage is prone to occur on the boundary of the diameter-extended portion 101 and the diameter-diminishing portion 102, also on a periphery of an external surface of the boundary. Alternatively, to address the leakage issue, the shielding layer can be directly and completely formed on the entire external surface of the hollow micro-pipe 10.

The present invention may alternatively use finite-difference time domain (FDTD) method for electromagnetic numerically simulating the focus figure of the light beam from the optical head.

Figure 2:
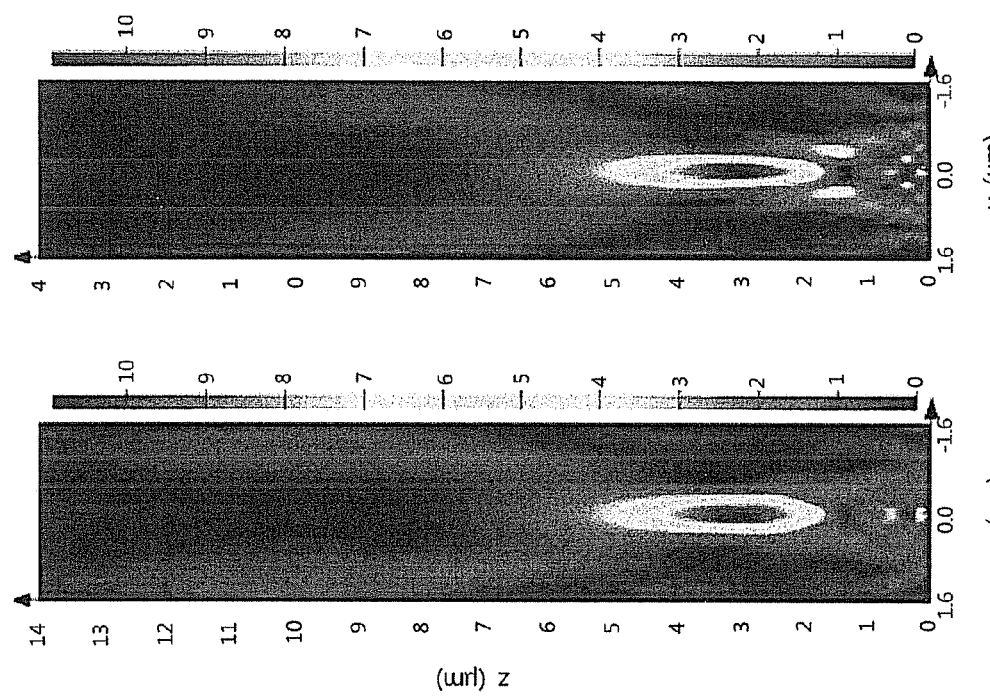
FIG. 2 is a numerical simulating graph of the optical head without blocking process at center according to an embodiment of the present invention, wherein X-axis and Y-axis represent radial direction, Z-axis represents longitudinal direction and colors represent the magnitude of the light intensity.

FIG. 2 is a diagram showing numerical simulation results of the optical head according to the present invention without stuffing member at center, wherein x and y-axes represent radial directions, z-axis represents longitudinal direction and colors represent magnitudes of light intensity. From the diagram, emergent light of the optical head shows less features of Bessel beam. Light beam starts focusing at the far field. The light beam looks like candlelight with a focal length less than 2 μm. In addition, it is observed that scattered light occurred around light emergent surface. It might be resulted by the light beam emerges from the hollow center of the hollow micro-pipe 10. These scattered light significantly reduces the interference effect of the emergent light of the hollow micro-pipe 10 which causes the emergent beam to fail to become an ideal Bessel beam.

In view of the foregoing numerical simulation results, as preferred embodiments, there is a non-transparent stuffing member 11 such as a column body is disposed into the hollow micro-pipe 10 to prevent light from transmitting to the hollow area at the center of the hollow micro-pipe 10. And for preventing the stuffing member 11 from light energy absorption, a metal layer (not shown) is preferred to be formed on the external surface of the stuffing member 11 or the interior surface of the hallow micro-pipe 10. Moreover, in the implementation, a metal material is coated on the external surface of 0.5-mm lead of a propelling pencil for use as the stuffing member 11. To sum up, a better focusing result can be achieved by making the light beam as possibly propagate in the annular pipe of the hollow micro-pipe 10.

Besides, the ratio of the inner diameter of the hollow micro-pipe 10 to the outer diameter thereof is an important design parameter of the optical head. It is discovered that the best ratio of the inner diameter to the outer diameter is around 0.7-0.8:1. If the ratio is close to 0.9:1 (i.e. with reduced thickness of the pipe), increasing light intensity of side lobes are obtained. That is, high order (order 1 or 2) interference fringe is getting more energy and the intensity of the major beam (order 0) is reduced, which is unfavorable to the application.

Figure 3:
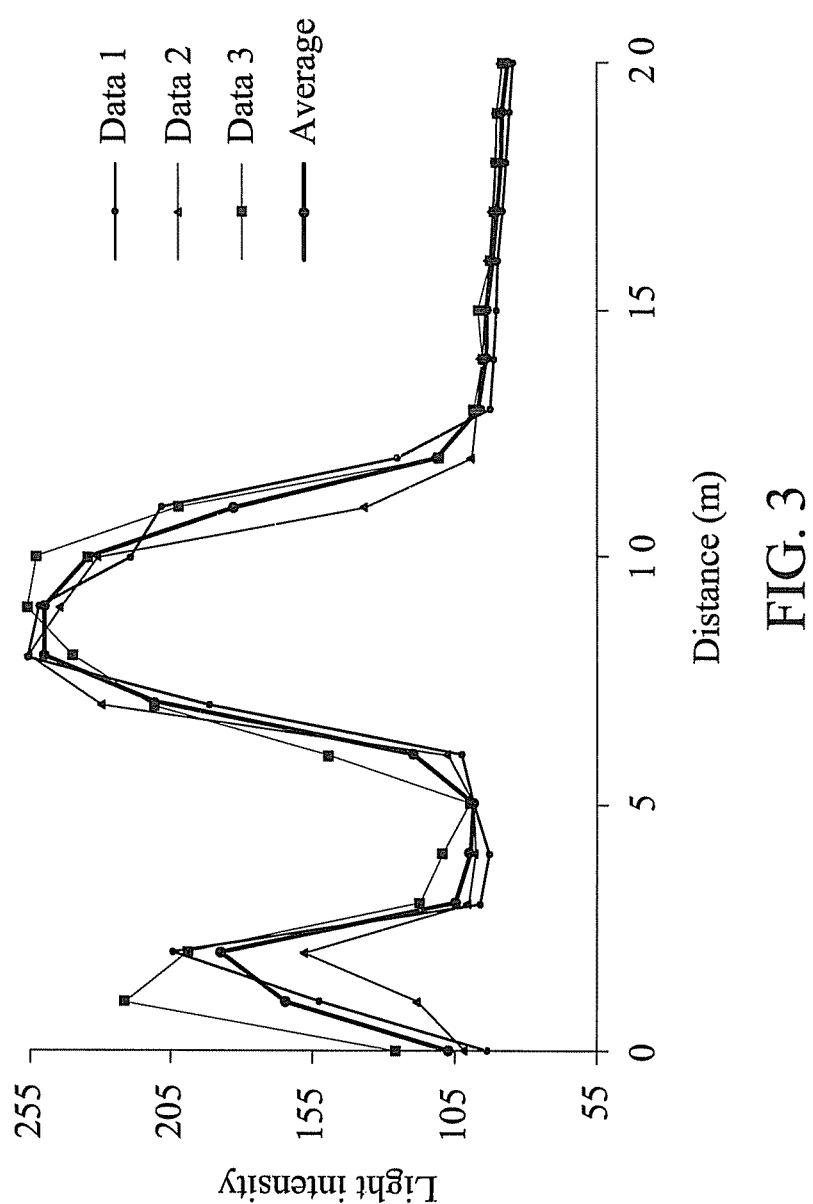
FIG. 3 is a diagram showing experimental results of the light intensity of the optical head according to an embodiment of the present invention, wherein x-coordinate is the distance between focal planes of the object lens of the charged coupled device and y-coordinate is the light intensity observed by CCD.

FIG. 3 is a diagram showing an experimental result of the light intensity of the optical head according to an embodiment of the present invention, wherein x-coordinate is the distance between the object lens of charge coupled device (CCD) and focal plane of the object lens, and y-coordinate is the light intensity observed by CCD. From the diagram, the intensity of the light beam started increasing at 6 μm from the optical head, reached maximum light intensity at 9 μm, and returned to the level before increasing at 12 μm. Accordingly, the focal length of the focused beam was about 6 μm. As for those stronger light near the area of emergent surface, it might be resulted from the light leakage due to bad quality of metal sputtering.

Figure 4:
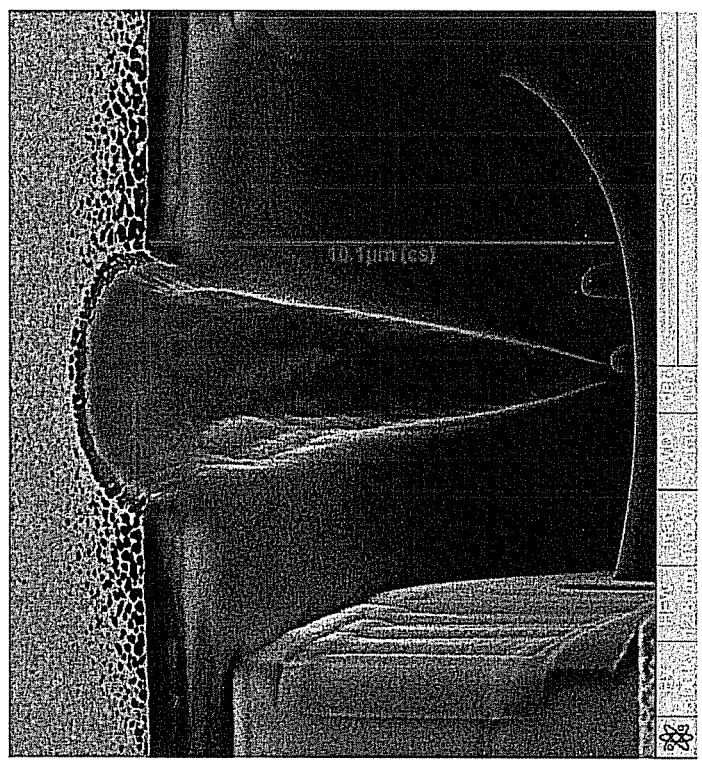
FIG. 4 is a diagram showing results of exposing AZ4620 photoresist by the optical head according to an embodiment of the present invention.

FIG. 4 illustrates a photograph of exposed AZ4620 photoresist which was made by the optical head according to an embodiment of the present invention. From this photo, it can be known that the exposed photoresist hole was conic, having a diameter of 4.06 μm and thickness of 10.1 μm, i.e., a structure of high aspect ratio 2.5. Performing exposure experiment is to verify the feasibility of sub-wavelength lithography. Based on the experimental results, it has been proved that the optical head according to the embodiment of the present invention formed a photoresist hole having size about several wavelength and aspect ratio above 5.

Referring to FIG. 5, it is a flow chart of fabricating the optical head according to an embodiment of the present invention using a quartz tube, and the experimental conditions are as followings. A quartz tube (the one in the embodiment is made by Sutter Instrument Inc. and the quartz is HSQ300 from Heraeus Inc) having an outer diameter of 1.00 mm and an inner diameter of 0.70 mm in the embodiment is provided. A process of pulling the quartz tube is performed so that the diameter in the center of the quartz tube can be shrunk. The puller in the embodiment is an Laser Based Micropipette Puller made by Sutter Instrument Inc. (model P-2000). Because the quartz tube has homogeneous and isotropic material features, i.e., same mechanical properties in every dimension, if the two ends are imposed on coaxial pulling forces, inner and outer diameters should shrink by the same ratio. The final outer diameter at the tip is 2.748 μm and inner diameter at the tip is 2.090 μm after the pulling. The ratio of the outer diameter to the inner diameter at the tip is 1:0.76, which is pretty close to that 10:7 before pulling. After pulling, a sputtering machine is used to coat a gold film on the external surface of the quartz tube, and then slicing the ends of the quartz tube by a ceramic knife, and cutting the quartz tube in two by a focused ion beam (FIB) aiming at the shrunk area of the quartz tube. Finally, a 0.5-mm lead for a commercially available propelling pencil that is coated with a gold film of about 200 nm is then disposed into the quartz tube for filling the hollow center of the quartz tube.

Referring to FIG. 6, a flow chart of fabricating the optical head is shown according to an embodiment of the present invention, and the specific experiment and corresponding parameters are described as followings. A hollow optical fiber which is flexible fused silica capillary tubing made by Polymicro Technologies Inc. in the embodiment, is provided. The flexible fused silica capillary tubing is mainly made by silicon dioxide which has a refractive index=1.47012 at wavelength=400 nm similar to that of quartz, but has higher flexibility and is coated with polyimide (PI) film for preventing the optical fibers from being damaged easily. The optical fibers with a PI film have an outer diameter of 435±10 μm and an inner diameter of 320±6 μm and the thickness of the PI film is 18 μm. The PI film is removed by burning up and a pulling step is performed so that the optical fibers have an outer diameter of 2.893 μm at the tip after final pulling. Remaining steps are generally similar to the foregoing quartz tube optical head, and thus further description is omitted.

Given the above, the experimental results prove that the optical head according to the embodiments of the present invention can realize the excellent result of the size of sub-wavelength focal spot and deep focal length.

The foregoing embodiment illustratively explained the theory and efficacy of the present invention rather than limiting the content thereof. Those who ordinarily skilled in the art can perform alteration without departing from the spirit and scope of the present invention. Thus, the rights protection of the present invention should be as the following list.

What is claimed is:

1. An optical head, comprising:
   a hollow micro-pipe formed by a transparent material and having a diameter-expanded portion and a diameter-diminishing portion connected to the diameter-expanded portion at one end; and
   a stuffing member formed by non-transparent material;
   wherein the stuffing member is stuffed inside the hollow micro-pipe so that when an incident light is introduced into the hollow micro-pipe, a center-shielding effect provided by the stuffing member makes the incident light transmit along the wall of the hollow micro-pipe, and the incident light is focused by and emitted from the diameter-diminishing portion to possess deep focal length.

2. The optical head of claim 1, wherein the diameter-diminishing portion is cone shaped.

3. The optical head of claim 1, wherein the stuffing member is a column body.

4. The optical head of claim 1, wherein the hallow micro-pipe is made of quartz.

5. The optical head of claim 1, wherein the hallow micro-pipe is made of optical fiber material.

6. The optical head of claim 1, wherein the optical fiber material is silica dioxide.

7. The optical head of claim 1, wherein the stuffing member is a carbon bar.

8. The optical head of claim 1, wherein a metal layer is formed on an external surface of the stuffing member.

9. The optical head of claim 1, wherein a metal layer is formed on an internal surface of the hollow micro-pipe.

10. The optical head of claim 1 further comprising a shielding layer formed on an external surface of the diameter-expanded portion of the hallow micro-pipe.

11. The optical head of claim 10, wherein the shielding layer is made of metal or non-metal material.

12. The optical head of claim 1, further comprising a shielding layer completely formed an external surface of the hollow micro-pipe except for two ends thereof for guiding incident light and emergent light.

13. The optical head of claim 12, wherein the shielding layer is made of metal or non-metal material.

14. The optical head of claim 1, wherein a ratio of inner diameter to outer diameter of the hollow micro-pipe is 0.7 to 0.8.

15. The optical head of claim 1, wherein the outer diameter of a tip of the diameter-diminishing portion is smaller than 20 μm.

* * * * *